(12) United States Patent
Boss

(10) Patent No.: US 11,385,294 B2
(45) Date of Patent: Jul. 12, 2022

(54) ESTIMATING A BATTERY STATE FROM GRADIENTS OF ELECTRICAL IMPEDANCE MEASUREMENTS

(71) Applicant: NOVUM engineerING GmbH, Dresden (DE)

(72) Inventor: Valentin Boss, Dresden (DE)

(73) Assignee: NOVUM engineerING GmbH, Dresden (DE)

( * ) Notice: Subject to any disclaimer, the term of this patent is extended or adjusted under 35 U.S.C. 154(b) by 0 days.

(21) Appl. No.: 17/077,893

(22) Filed: Oct. 22, 2020

(65) Prior Publication Data

US 2021/0123978 A1  Apr. 29, 2021

(30) Foreign Application Priority Data

Oct. 23, 2019 (EP) ..................... 19204752

(51) Int. Cl.
  *G01R 31/389* (2019.01)
  *G01R 31/387* (2019.01)
  *G01R 31/392* (2019.01)

(52) U.S. Cl.
  CPC ......... *G01R 31/389* (2019.01); *G01R 31/387* (2019.01); *G01R 31/392* (2019.01)

(58) Field of Classification Search
  None
  See application file for complete search history.

(56) References Cited

U.S. PATENT DOCUMENTS

| | | | |
|---|---|---|---|
| 4,678,998 A | 7/1987 | Muramatsu | |
| 6,307,378 B1 | 10/2001 | Kozlowski | |
| 8,994,340 B2 | 3/2015 | Matthe et al. | |
| 2012/0280693 A1* | 11/2012 | Lammers | H01M 10/48 324/430 |
| 2013/0207671 A1 | 8/2013 | Torai et al. | |
| 2013/0307487 A1 | 11/2013 | Matthe et al. | |
| 2014/0229130 A1 | 8/2014 | Koba et al. | |

(Continued)

FOREIGN PATENT DOCUMENTS

| | | |
|---|---|---|
| DE | 102014217135 A1 | 3/2016 |
| DE | 112015005201 T5 | 7/2017 |

(Continued)

OTHER PUBLICATIONS

European Patent Office, Extended European Search Report and Opinion, European Patent Application 19204752.0, dated May 25, 2020, eight pages.

*Primary Examiner* — Jas A Sanghera
(74) *Attorney, Agent, or Firm* — Fenwick & West LLP

(57) ABSTRACT

A computer-implemented method and a battery state estimating system for estimating a battery state of an electrochemical battery, including: calculating electrical impedance gradients from a provided series of electrical impedance measurements to generate a series of electrical impedance gradients; and determining a battery state of the electrochemical battery using computational means configured to receive as inputs at least the series of electrical impedance gradients, the computational means receiving and processing at least the provided series of calculated electrical impedance gradients to generate therefrom at least one output signal representing a battery state associated with the electrochemical battery.

13 Claims, 3 Drawing Sheets

(56) References Cited

U.S. PATENT DOCUMENTS

2018/0275201 A1    9/2018  Oguma et al.
2020/0153264 A1\*  5/2020  Osada ..................... B60L 58/16
2020/0371164 A1\*  11/2020  Scott ................... G01R 31/364

FOREIGN PATENT DOCUMENTS

| | | |
|---|---|---|
| DE | 112016002873 T5 | 3/2018 |
| DE | 112016003789 T5 | 5/2018 |
| EP | 1129343 B1 | 6/2008 |
| EP | 1702219 B1 | 5/2012 |
| JP | 2003-249271 A | 9/2003 |
| JP | 4038788 B2 | 1/2008 |
| WO | WO 00/16083 A1 | 3/2000 |
| WO | WO 03/071617 A2 | 8/2003 |
| WO | WO 2005/059579 A1 | 6/2005 |
| WO | WO 2016/080111 A1 | 5/2016 |
| WO | WO 2016/208745 A1 | 12/2016 |
| WO | WO 2017/110437 A1 | 6/2017 |

\* cited by examiner

US 11,385,294 B2

ESTIMATING A BATTERY STATE FROM GRADIENTS OF ELECTRICAL IMPEDANCE MEASUREMENTS

CROSS-REFERENCE TO RELATED APPLICATION

This application claims priority to European Patent Application No. 19 204 752.0, filed on Oct. 23, 2019, which is incorporated by reference herein in its entirety.

BACKGROUND

The invention relates to a computer-implemented method of estimating a battery state of an electrochemical battery. Furthermore, the invention relates to a battery state estimating system for estimating a battery state of an electrochemical battery.

For example, the computer may be a microcontroller. For example, the computer or microcontroller may include a processing unit, a memory, and input/output ports.

WO 2005/059579 A1 and EP 1702219 B1 describe an apparatus and a method for estimating a state of charge of a battery by using a neural network. The apparatus includes a sensing section for detecting current, voltage and a temperature from a battery cell and a neural network performing a neural network algorithm and a learning algorithm based on data of the current, voltage and temperature transmitted thereto from the sensing section and present time data.

U.S. Pat. No. 4,678,998 A describes a battery condition monitor and a monitoring method.

JP 2003-249271 A and JP 4038788 B2 describe the determining of a deterioration state and a residual capacity of a battery in real time. In an example, as an operation parameter of the battery under operation, a measurement unit can measure and sample periodically the voltage of the battery, the current, the internal impedance, and the temperature. The internal impedance of the battery is measured by adding an AC signal of 1 kHz and 100 mA to the battery. A first neural network can decide on a deterioration state as "normal", "caution", and "degradation", based on the operation parameter of the battery from the measurement unit, and a second neural network can decide on the residual capacity based on the operation parameter of the battery and the deterioration state from the first neural network.

U.S. Pat. No. 6,307,378 B1 describes a method and an apparatus for measurement of electrochemical cell and battery impedances.

WO 03/071617 A2 describes a method for determining a condition parameter of an electrochemical cell, such as in a battery. In an example, measurement signals such as terminal voltages, cell voltages, load current, charging current, ambient temperature, battery surface temperature, terminal temperature, internal battery temperature, and impedance signals are passed to a feature extraction processing algorithm, which generates a feature vector and a feature flag. Data from the feature vector is passed to a neural network ISOC predictor for initial battery capacity state of charge estimation, and a neural network CSOC predictor for continuous prediction of SOC during operation. In another example, the information contained in a feature vector is used by a neural network SOH classifier, a linear/statistical SOH classifier, and a fuzzy logic SOH classifier for state of health classification.

WO 2016/208745 A1 and its translation DE 112016002873 T5 describe a method of recognizing the state of charge or depth of discharge of a battery. The method includes determining the complex impedance between the positive and negative electrodes of a battery with respect to a plurality of frequencies.

WO 2017/110437 A1 and its translation DE 11 2016 003 789 T5 describe an estimation device that estimates the residual capacity of a lithium ion battery.

WO 2016/080111 A1 and its translation DE 11 2015 005 201 T5 describe an estimation device for estimating a remaining stored power amount of a storage battery.

US 2013/0307487 A1 and U.S. Pat. No. 8,994,340 B2 describes a method and a system for determining the temperature of cells in a battery pack, without using temperature sensors, by measuring the impedance of the cells and using the impedance to determine the temperature.

WO 00/16083 and EP 1129343 B1 describe a device that measures real and imaginary parts of complex immittance of a cell or battery at n discrete frequencies. The device determines cell/battery properties by evaluating components of an equivalent circuit model.

SUMMARY OF THE INVENTION

It is an object of the invention to provide a novel method of estimating a battery state of an electrochemical battery based on electrical impedance measurements. It is desirable that the method uses information included in a series of electrical impedance measurements for different measurement frequencies.

The invention is indicated in the independent claims. Further embodiments are indicated in the dependent claims.

According to one aspect of the invention, there is provided a computer-implemented method of estimating a battery state of an electrochemical battery, the method comprising: (i) providing a series of electrical impedance measurements of an electrochemical battery, each electrical impedance measurement being measured at a respective measurement frequency, the series being ordered according to the respective measurement frequencies, (ii) calculating electrical impedance gradients from the series of electrical impedance measurements to generate a series of electrical impedance gradients, (iii) determining a battery state of the electrochemical battery using computational means configured to receive as inputs at least the series of electrical impedance gradients, wherein the series of calculated electrical impedance gradients is provided to the computational means, wherein the computational means receives and processes at least the provided series of calculated electrical impedance gradients to generate therefrom at least one output signal representing a battery state associated with the electrochemical battery.

Thus, a series of electrical impedance gradients is constructed based on the provided series of electrical impedance measurements.

And, an output signal is generated that represents a battery state associated with the electrochemical battery. For example, the at least one output signal may represent a classification and/or an estimation of a battery state.

For example, the output signal may include a visual signal, which may be displayed.

For example, the output signal may be transmitted or communicated or output to an output unit for outputting the signal.

Preferably, the electrochemical battery is a rechargeable electrochemical battery.

Estimating a battery state in the form of the state of charge is highly relevant, for example, for mobile appliances such as mobile tools or mobile, electrically driven apparatuses, such as vehicles.

Similarly, an estimation of a battery state in the form of the state of health is of high importance with respect to a reliability of a device.

For many applications, in particular of a rechargeable electrochemical battery, knowledge of a battery state in the form of the battery temperature of an electrochemical battery is of high importance, as well.

It has been found that the variation of the electrical impedance dependent on the index of the series of measurements (and, therefore, dependent on the measurement frequency or on the logarithm thereof) is valuable information for evaluating a battery state. The series of calculated electrical impedance gradients is provided to the computational means for determining a battery state of the electrochemical battery. The gradients emphasize information about the variation of the electrical impedance dependent on the measurement frequency, a logarithm of the measurement frequency, or the index of measurements. Therefore, by providing the gradients, information is provided for evaluation by the computational means, which information would not be available for direct evaluation otherwise.

For example, electrical impedance gradients of the series of electrical impedance measurements may be calculated with respect to the measurement frequency, with respect to a logarithm of the measurement frequency, or with respect to the index of the elements of the series of measurements. That is, a respective gradient at a respective index of the elements of the series of measurements may be calculated as the change in electrical impedance per change of the measurement frequency, per change of the logarithm of the measurement frequency, or per change of the index of the elements of the series of measurements.

For example, for a respective element of the series of electrical impedance measurements, a corresponding gradient may be calculated to express the change in the value of the electrical impedance measurements per change in the measurement frequency, per change in a logarithm of the measurement frequency, or per change in the index of elements, at the respective measurement frequency, the logarithm thereof, or at the respective index of elements. Thus, the gradient may be calculated for a series of discrete electrical impedance measurements. Calculating the gradient may correspond to differentiating a continuous electrical impedance curve with respect to the measurement frequency, or with respect to the logarithm of measurement frequency or the index of elements of the series of measurements. For example, for a respective element of the series of electrical impedance measurements, a corresponding gradient may be calculated based on a difference between the element and a neighboring element of the series of electrical impedance measurements, divided by the difference in the respective indices of elements or in the respective measurement frequencies.

For example, calculating gradients of the series of electrical impedance measurements may include calculating gradients of the real part and gradients of the imaginary part of the series of electrical impedance measurements.

The electrical impedance may also be termed a complex electrical impedance and may be a complex number and may be provided being expressed in a unit of electrical resistance, for example, ohm.

For example, each electrical impedance measurement of the provided series of electrical impedance measurements may be or include a complex number that defines a real part and an imaginary part of the respective electrical impedance. The electrical impedance may also be represented in polar form, defining a magnitude (or amplitude) and an angle (or phase).

For example, the electrical impedance measurements of the provided series of electrical impedance measurements may be in the form of respective complex representations (complex numbers). Or, for example, the electrical impedance measurements may each be in the form of amplitude and phase, and the step of providing may comprise converting the electrical impedance measurements into electrical impedance measurements in the form of respective complex representations of the electrical impedance measurements. A "complex representation" of an electrical impedance measurement comprises a complex number. For example, the complex representation of an electrical impedance measurement may be a complex number.

Herein, the term "battery" is to be understood as including a battery cell. The battery may include one or more battery cells. In particular, the term "battery" includes a battery cell as well as a battery composed of multiple battery cells.

Specifically, the electrochemical battery is understood as defining a device consisting of one or more electrochemical cells with external electrical connections. For example, the battery may include two external electrical connections for drawing power from the one or more electrochemical cells and, in case of a rechargeable electrochemical battery, for (re-)charging the one or more electrochemical cells.

For example, the respective measurement frequency may be a frequency of a signal input to the electrochemical battery. For example, the signal may be a sinusoidal signal.

Preferably, each electrical impedance gradient of the series of electrical impedance gradients comprises a complex number that defines a real part and an imaginary part of the respective electrical impedance gradient.

The elements of the series of electrical impedance gradients are fed to corresponding inputs of the artificial neural network means. Thus, an automated battery state estimation based on the series of electrical impedance gradients is made possible.

Preferably, the series of electrical impedance measurements are provided in the form of a digital signal.

Preferably, the series of electrical impedance measurements of the electrochemical battery are provided in a digitally represented form.

The series of electrical impedance measurements may be received from an electrical impedance measuring unit or electrical impedance measuring means, for example.

Providing the series of electrical impedance measurements may comprise receiving the electrical impedance measurements of the series one after another.

The series of electrical impedance measurements may be communicated to a battery state estimating system comprising means for carrying out the steps of the method. The system may be configured for providing (including receiving) the communicated electrical impedance measurements.

In one or more embodiments, the measurement frequencies are assumed to be logarithmically equidistantly spaced. Preferably, the measurement frequencies are logarithmically equidistantly spaced over at least four decades of the measurement frequency range (the frequency range of the measurement frequencies), more preferably over at least five decades of the measurement frequency range.

Preferably, the measurement frequencies include a measurement frequency in the range of 0.1 to 1.0 Hz.

Preferably, the measurement frequencies include a measurement frequency in the range of 1 kHz to 10 kHz.

Preferably, the measurement frequencies include at least 4 (four) measurement frequencies per decade of the measurement frequency range, more preferably at least five measurement frequencies per decade of the measurement frequency range.

The step of providing the series of electrical impedance measurements may comprise receiving a plurality of electrical impedance measurements, each electrical impedance measurement being measured at a respective measurement frequency, and:
- arranging the plurality of electrical impedance measurements according to the associated measurement frequencies to provide the series of electrical impedance measurements, or
- providing the plurality of the electrical impedance measurements as the series of electrical impedance measurements.

For example, the arranged plurality of electrical impedance measurements, optionally including the respective measurement frequencies, may be provided as the series of electrical impedance measurements.

The plurality of electrical impedance measurements, or the series of electrical impedance measurements may be received in the form of an electrical impedance spectrum.

In the series of electrical impedance measurements, for example, the electrical impedance measurements may include the respective measurement frequencies. For example, each electrical impedance measurement may include the measured value of the electrical impedance and the measurement frequency. However, the electrical impedance measurements may as well be in the form of respective electrical impedances, represented as respective complex numbers, or each represented as an amplitude and phase.

An output signal is generated that represents a battery state associated with the electrochemical battery. For example, the at least one output signal may represent a classification and/or an estimation of a battery state.

The battery state may include at least one of a state of charge (SoC) of the electrochemical battery, a state of health (SoH) of the electrochemical battery, a state of function (SoF) of the electrochemical battery, a capacity of the electrochemical battery, and a temperature of the electrochemical battery.

For example, the output signal may be transmitted or communicated or output to an output unit for outputting the signal, and/or for outputting a visual signal based on the output signal. The visual signal may be displayed.

Preferably, the generated series of electrical impedance gradients has a predetermined number of elements. For example, the number of elements may correspond to a number of inputs of the computational means for receiving the series of electrical impedance gradients.

In one or more embodiments, the method may comprise adjusting the number of elements of the series of electrical impedance measurements or the number of elements of the series of electrical impedance gradients to a predetermined number of elements.

Thus, the number of elements may be adjusted to a corresponding number of inputs of the computational means for receiving the series of electrical impedance gradients.

For example, the number of elements of the series of electrical impedance gradients may be adjusted to a predetermined number of elements by adjusting the number of elements of the series of electrical impedance measurements to the predetermined number of elements. For example, the method may comprise adjusting the number of elements of the series of electrical impedance measurements to a predetermined number of elements, prior to calculating the gradients.

For example, adjusting the number of elements of the series of electrical impedance measurements or the number of elements of the series of electrical impedance gradients may comprise at least one of interpolating between electrical impedance measurements/gradients, selecting from the electrical impedance measurements/gradients, and extrapolating the electrical impedance measurements/gradients. In the adjusting step, the number of elements may be increased, maintained, or decreased.

Preferably, the computational means include artificial neural network means configured to receive as inputs at least the series of electrical impedance gradients.

In one or more embodiments, the method comprises: determining a battery state of the electrochemical battery using artificial neural network means configured to receive as inputs at least the series of electrical impedance gradients, wherein the series of calculated electrical impedance gradients is provided to the artificial neural network means, wherein the artificial neural network means receives and processes at least the provided series of calculated electrical impedance gradients to generate therefrom at least one output signal representing a battery state associated with the electrochemical battery.

In particular, the artificial neural network means may receive and process the series of electrical impedance gradients to generate therefrom the at least one output signal in accordance with a predetermined processing structure of the artificial neural network means.

For example, the computational means or the artificial neural network means may receive and process the series of electrical impedance gradients to generate therefrom at least one output signal representing a state of charge of the electrochemical battery.

For example, the computational means or the artificial neural network means may receive and process the series of electrical impedance gradients to generate therefrom at least one output signal representing a state of health of the electrochemical battery.

For example, the computational means or the artificial neural network means may receive and process the series of electrical impedance gradients to generate therefrom at least one output signal representing a state of function of the electrochemical battery.

For example, the computational means or the artificial neural network means may receive and process the series of electrical impedance gradients to generate therefrom at least one output signal representing a temperature associated with the electrochemical battery.

The computational means or the artificial neural network means may generate more than one output signal, the respective output signals representing respective battery states of the electrochemical battery. The battery states may include one or more of the battery states mentioned above. For example, the generated output signals may include an output signal representing state of charge of the electrochemical battery, an output signal representing a state of health of the electrochemical battery, an output signal representing a state of function of the electrochemical battery, and/or an output signal representing a temperature of the electrochemical battery, or a temperature associated with the electrochemical battery, etc.

In particular, the computational means or artificial neural network means may be configured to receive as first inputs the series of electrical impedance gradients and configured to receive as second inputs the series of electrical impedance measurements. For example, an input (such as an input vector or input array) of the computational means or artificial neural network means may include the first inputs and the second inputs. The method may comprise adjusting the number of elements of the series of electrical impedance measurements to a predetermined number of elements.

For example, the artificial neural network means may include a deep neural network (DNN). A deep neural network has an input layer, more than one hidden layer, and an output layer.

In one or more embodiments, the artificial neural network means include a convolutional neural network (CNN).

Convolutional neural networks are known for classifying images, for example. A convolutional neural network has an input layer, at least one convolutional layer, and an output layer. A CNN may be a deep neural network. A CNN may be trained for identifying patterns in the series of electrical impedance gradients and associating the patterns with respective battery states.

For example, the artificial neural network means may have been trained to identify a battery state of a (rechargeable) electrochemical battery of a specific chemistry type by detecting characteristic features of the series of electrical impedance gradients, using training data for different voltages of batteries, for temperatures of a predetermined temperature range, and for different states of health of the batteries.

In at least one embodiment, the method comprises: measuring the electrical impedance of an electrochemical battery at different measurement frequencies to provide the series of electrical impedance measurements, using electrical impedance measuring means.

For example, the series of electrical impedance measurements may be provided based on the measured electrical impedance at the different measurement frequencies.

The electrical impedance measurements may be measured in any order and/or concurrently for the respective measurement frequencies.

For example, the electrical impedance measuring means may be configured to input a signal including a respective frequency to the electrochemical battery, and determine a ratio of amplitude and phase of a response signal of the same frequency to the amplitude and phase of the input signal, the frequency of the signal and of the response signal corresponding to the measurement frequency.

For example, the electrical impedance measuring means may be electrical impedance spectroscopy measuring means configured for measuring electrical impedance of an electrochemical battery at a series of measurement frequencies. That is, the electrical impedance of the electrochemical battery is measured according to a process of electrochemical impedance spectroscopy.

Using electrochemical impedance spectroscopy, electrochemical processes in the electrochemical battery are characterized by electrical measurements that characterize the AC response of the electrochemical battery to an applied AC signal. The chemical processes in the battery, in addition to the structural configuration and the configuration of the connectors, lead to characteristic frequency dependencies of the measured impedance, which include characteristic variations of the measured impedance dependent on the measurement frequency.

During the measurement of an electrical impedance at a specific measurement frequency, a DC offset signal (an offset voltage or an offset current) or DC bias signal may be applied to the battery, which is modulated by the AC signal of the measurement frequency.

For example, the series of electrical impedance measurements may be received from an independent measuring circuit or electrical impedance measuring means. However, a system for estimating a battery state may as well include electrical impedance measuring means for measuring and providing the series of electrical impedance measurements from an electrochemical battery.

For example, the electrochemical battery may be a lithium-ion battery or a lead-acid battery.

According to an aspect of the invention, there may be provided a computer-implemented method of monitoring a battery state of an electrochemical battery. The monitoring method may include the steps of the method of estimating a battery state.

For example, the method may be implemented in a battery monitoring system for monitoring a battery state of an electrochemical battery.

For example, the method may be implemented in a battery charging system for recharging a rechargeable electrochemical battery.

According to an aspect of the invention, there is provided a battery state estimating system for estimating a battery state of an electrochemical battery, the system comprising means for carrying out the steps of the method.

For example, the system may be or may be comprised in a system for monitoring a battery state of an electrochemical battery.

For example, the system may be or may be comprised in a battery charging system for recharging a rechargeable electrochemical battery.

In one or more embodiments, the battery state estimating system further comprises electrical impedance measuring means configured for measuring the electrical impedance of an electrochemical battery at different measurement frequencies to provide the series of electrical impedance measurements.

BRIEF DESCRIPTION OF THE DRAWINGS

Preferred embodiments of the invention will now be described in conjunction with the drawings, in which.

DETAILED DESCRIPTION

Figure 1:
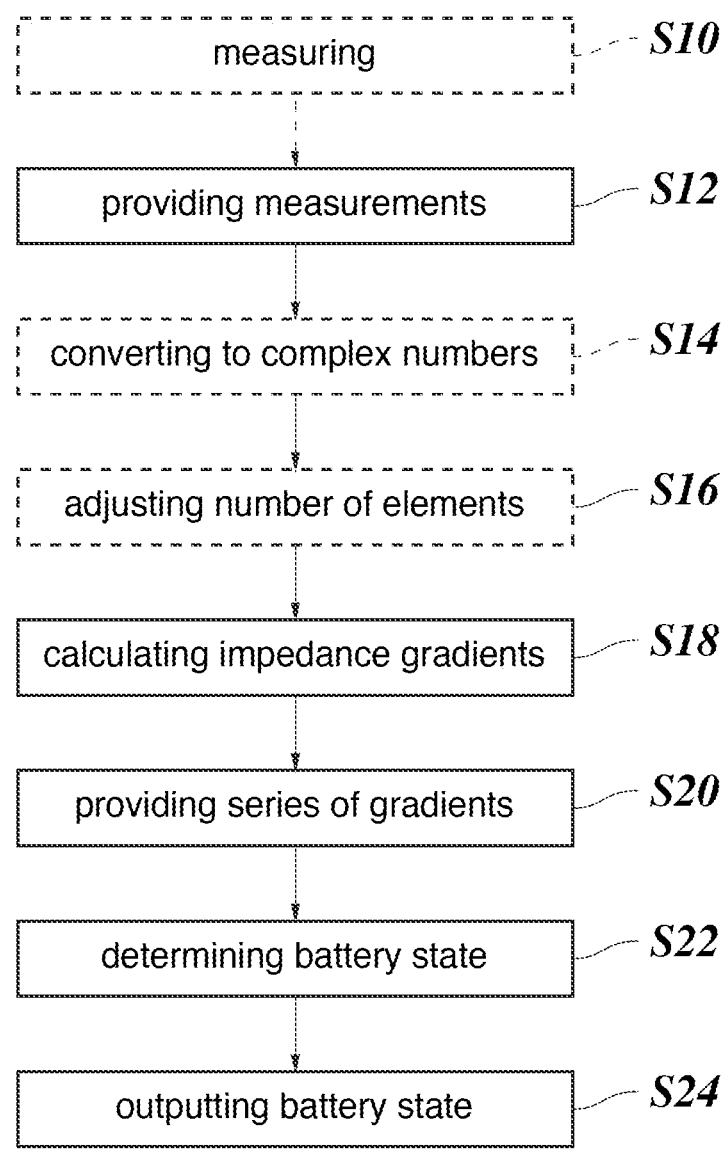
FIG. 1 is a schematic illustration of a method of estimating a battery state of a rechargeable electrochemical battery.

FIG. 1 schematically shows a computer-implemented method of estimating a battery state of a rechargeable electrochemical battery, for example, a lithium-ion battery. For example, the method may be performed by a battery state estimating system as described further below with respect to FIG. 4.

Step S10 is a step of measuring the electrical impedance of the electrochemical battery at different measurements frequencies, using electrical impedance measuring means.

From measuring the electrical impedance, in step S12, a series of electrical impedance measurements of the electrochemical battery is provided in form of a digital signal, for example, as a data set. The series is ordered according to the respective measurement frequencies, preferably in the order of increasing measurement frequencies.

However, the method may also start with step S12 of providing the measurements, which may have been measured independently from the method, and may have been communicated to a computer performing the method.

In case the provided electrical impedance measurements are not yet in the form of complex numbers (representing complex impedance), the method may include an optional step S14 of converting the provided electrical impedance measurements to complex numbers.

In an optional step S16, the number of elements of the series of electrical impedance measurements is adjusted to a predetermined number of elements, for example, to a number of 21 elements.

Figure 2:
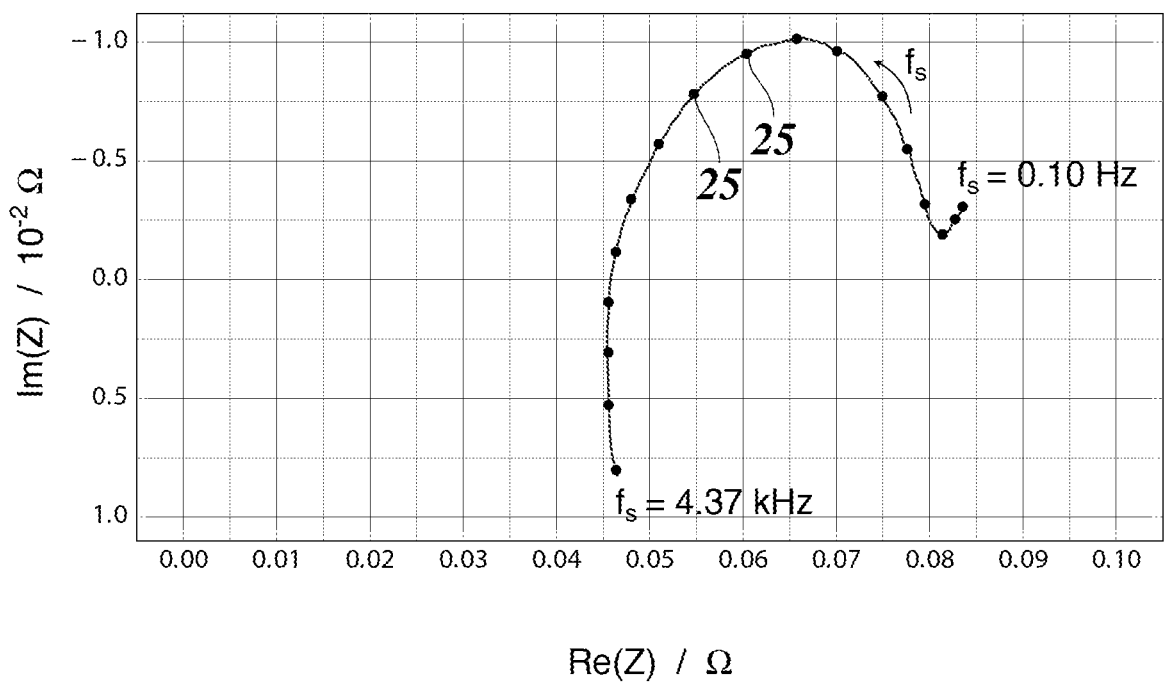
FIG. 2 is a schematic graph of a series of electrical impedance measurements of a rechargeable electrochemical battery measured at a respective measurement frequencies.

FIG. 2 exemplarily shows a series of electrical impedance measurements 25 measured at respective measurement frequencies $f_s$. FIG. 2 is a Nyquist diagram in the form of a two-dimensional graph of the imaginary part Im(Z) and the real part Re(Z) of electrical impedance Z. For illustration purposes, the elements of the series (that is, the measured impedances) are connected by a line. According to convention, the imaginary part is displayed in an inversed direction, with the imaginary part increasing towards the bottom of FIG. 2.

Preferably, the measurements 25 are taken at logarithmically progressing measurement frequencies. Preferably, the series of measurements 25 comprises at least 4 (four) measurements 25 per decade of the measurement frequency range. In FIG. 2, the electrical impedance measurements 25 of the series of electrical impedance measurements 25 are schematically indicated for illustration purposes, only, and range from measurement frequencies of $f_s=0.10$ Hz to $f_s=4.37$ kHz. The number of measurements 25 illustrated in FIG. 2 may deviate from the number of measurements 25 that are actually used, and is for illustration purposes, only.

In FIG. 2, an arrow $f_s$ shows the order of the measurements 25 with increasing measurements frequency $f_s$.

Returning to FIG. 1, in step S18, a series of electrical impedance gradients is calculated from the series of electrical impedance measurements 25.

Figure 3:
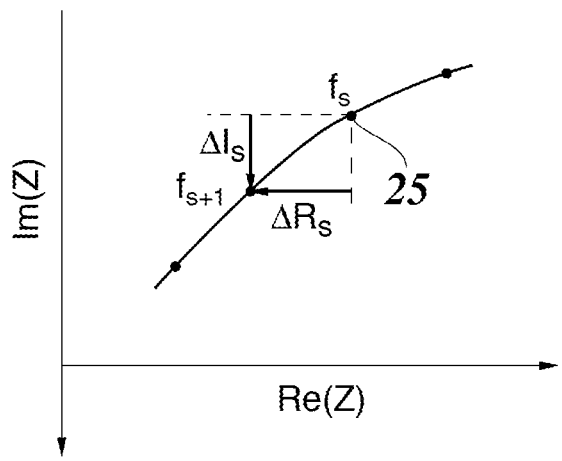
FIG. 3 is a schematic illustration of determining a gradient of the electrical impedance.

FIG. 3 schematically shows a part of a series of electrical impedance measurements 25, which are connected by a line. The series includes a first measurement 25 taken at a measurement frequency $f_s$, and a second measurement 25 taken at a measurement frequency $f_{s+1}$, wherein s and s+1 denote the respective indices of the series of measurements. The real part and the imaginary part of the difference between the measurements 25 are indicated as $\Delta R_s$, $\Delta I_s$.

For the respective measurement frequency $f_s$, the electrical impedance gradient with respect to the measurement frequency is calculated as follows: the real part of the electrical impedance gradient is calculated as: $\Delta R_s/(f_{s+1}-f_s)$; the imaginary part of the electrical impedance gradient is calculated as: $\Delta I_s/(f_{s+1}-f_s)$.

Thus, gradients of the series of electrical impedance measurements 25 with respect to the measurement frequency are calculated to generate a series of electrical impedance gradients.

In a further embodiment, the gradients may be calculated with respect to the index s of the elements of the series of measurements 25 as follows: the real part of the electrical impedance gradient may be calculated as: $\Delta R_s/((s+1)-s)=\Delta R_s$; the imaginary part of the electrical impedance gradient may be calculated as: $\Delta I_s/((s+1)-s)=\Delta I_s$.

In a still further embodiment, the gradients may be calculated with respect to a logarithm of the measurement frequency as follows: the real part of the electrical impedance gradient is calculated as: $\Delta R_s/(\log_B(f_{s+1})-\log_B(f_s))$; the imaginary part of the electrical impedance gradient is calculated as: $\Delta I_s/(\log_B(f_{s+1})-\log_B(f_s))$; wherein $\log_B$ is the logarithm to the base B; for example, B=10.

Returning to FIG. 1, in step S20, the series of electrical impedance gradients is provided to computational means in the form of artificial neural network means, configured to receive as inputs the series of electrical impedance gradients.

In step S22, the artificial neural network means process the series of electrical impedance gradients to generate therefrom an output signal representing a battery state. Thus, a battery state of the electrochemical battery is determined, based on the series of electrical impedance gradients. In step S24, the battery state is output. For example, the battery state may be a state of health of the battery.

Figure 4:
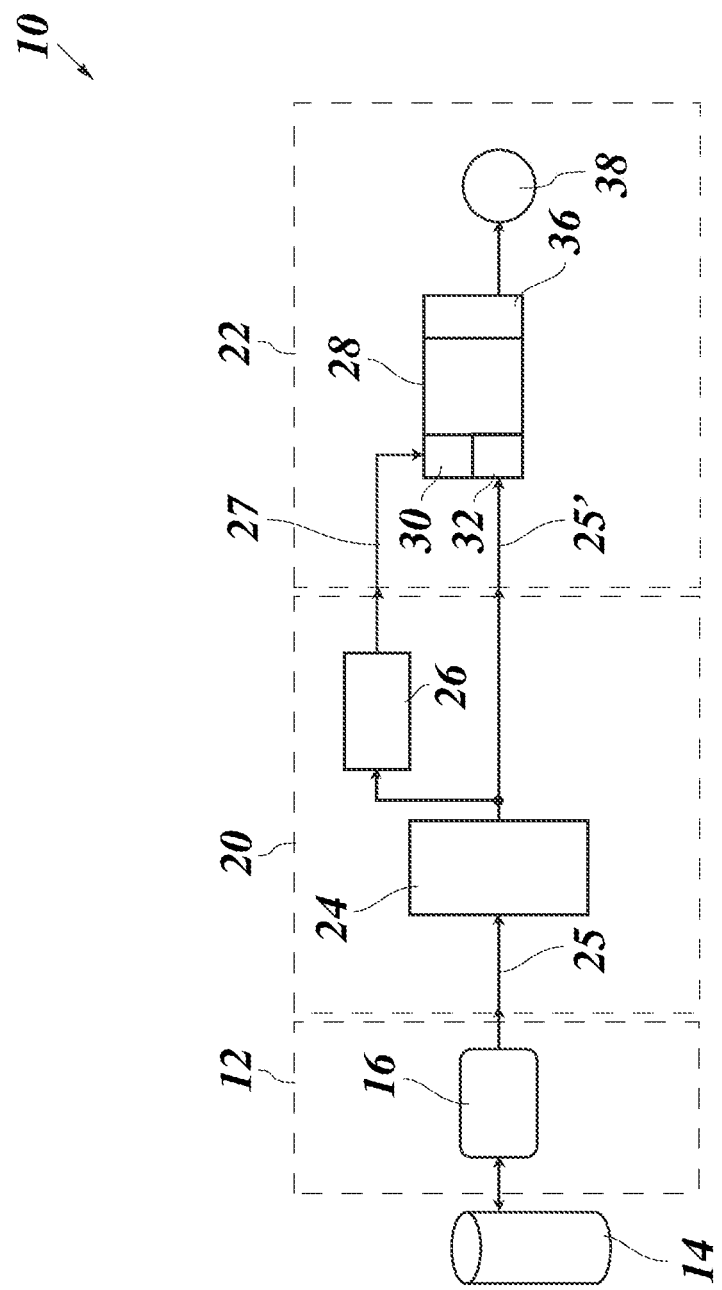
FIG. 4 is a schematic illustration of a system for estimating a battery state of a rechargeable electrochemical battery.

FIG. 4 schematically shows an example of a battery state estimating system 10 configured for performing the method of FIG. 1, the system optionally including electrical impedance measuring means 12. For example, the battery state estimating system 10 may be implemented in a computer, such as a microcontroller. For example, the microcontroller including the system 10 and, optionally, the electrical impedance measuring means 12 may be part of a battery monitoring system for monitoring a battery state of an electrochemical battery 14.

The electrical impedance measuring means 12 includes an electrical impedance measuring unit 16. The battery state estimating system 10 further includes a pre-processing unit 20 and computational means 22.

For a series of measurement frequencies $f_s$, the electrical impedance measuring unit 12 applies an excitation signal, for example a sinusoidal signal of the respective measurement frequency $f_s$, to an electrochemical battery 14 that is to be measured. The signal is input in the form of a small amplitude alternating current (AC) signal, and the alternating current response from the battery 14 is measured. For example, a current signal is input, and a voltage response signal is measured. Alternatively, a voltage signal is input, and a current response signal is measured. During the measurements, a direct current (DC) bias voltage or DC bias current may be applied in accordance with the type of the electrochemical battery 14. The measuring setup corresponds to electrochemical impedance spectroscopy (EIS) measurement setups known as such. The measurement frequencies are arranged or increased in equidistant steps on a logarithmic scale, for the respective measurements, in accordance with a measurement setup that is predetermined for the electrochemical battery 14.

The measured electrical impedance at a specific measurement frequency is the ratio of the amplitude and phase of the AC response signals to the amplitude and phase of the input signal and is represented as a complex number (complex impedance). For example, four different measurements frequencies may be used per decade of the measurement frequencies. Thus, a series of electrical impedance measurements 25 is measured.

The pre-processing unit 20 includes standardizing means 24 for providing the series of electrical impedance measurements 25 from the electrical impedance measurement means 12 and for adjusting the number of elements of the series of electrical impedance measurements 25 to a predetermined number of elements, for example, 21 elements. For example, the number of elements may be adjusted by interpolating the elements of the series. In case that the series of electrical impedance measurements 25 provided by the standardizing means 24 already has the target value of the predetermined number of elements, the standardizing means 24 maintains the number of elements.

The preprocessing unit 20 further includes gradient calculating means 26 that receive the standardized series of electrical impedance measurements (indicated as 25') from the standardizing means 24. The gradient calculating means 26 calculate gradients 27 of the series of electrical impedance measurements 25' with respect to the measurement frequency to generate a series of electrical impedance gradients 27, similar to what has been explained above with respect to FIG. 3. Thus, the gradient calculating means 26 generate a series of electrical impedance gradients 27 from the standardized series of electrical impedance measurements 25'.

By the standardizing means 24 adjusting the number of elements of the series of electrical impedance measurements 25, the number of elements of the series of electrical impedance gradients 27 is also adjusted to a predetermined number of elements.

The computational means 22 include artificial neural network means 28 having first input means 30 for receiving the series of electrical impedance gradients 27 from the gradient calculating means 26.

Furthermore, the artificial neural network means 28 has second input means 32 for receiving the standardized series of electrical impedance measurements 25 from the preprocessing unit 20.

Thus, the (standardized) series of electrical impedance measurements 25' and the series of electrical impedance gradients 27 together form an input array of the artificial neural network means 28. For example, each series may form a row of the input array.

Furthermore, the artificial neural network means 28 include output means 36 for outputting an output signal 38 representing a battery state, for example, a state of health, associated with the electrochemical battery 14. The artificial neural network means 28 receives and processes the standardized series of electrical impedance measurements 25' and the series of electrical impedance gradients 27 and generates therefrom the output signal.

For example, the artificial neural network means 28 may be a convolutional neural network (CNN), or a convolutional deep neural network. The artificial neural network means 28 has been trained to estimate the battery state 38 of the electrochemical battery 14 by detecting characteristic features of the series of standardized electrical impedance measurements 25' and the series of electrical impedance gradients 27. The determined battery state 38 is output by the output means 36.

The system may also be implemented with the artificial neural network means 28 having only the first input means 30 for receiving the series of electrical impedance gradients 27.

What is claimed is:

1. A computer-implemented method of estimating a battery state of an electrochemical battery, the method comprising:
providing a series of electrical impedance measurements of an electrochemical battery, each electrical impedance measurement being measured at a respective measurement frequency, the series being ordered according to the respective measurement frequencies,
calculating electrical impedance gradients from the series of electrical impedance measurements to generate a series of electrical impedance gradients, wherein calculating the electrical impedance gradients includes calculating gradients of a real part and gradients of an imaginary part of the series of electrical impedance measurements,
determining a battery state of the electrochemical battery using computational means configured to receive as inputs at least the series of electrical impedance gradients,
wherein the series of calculated electrical impedance gradients is provided to the computational means,
wherein the computational means receives and processes at least the provided series of calculated electrical impedance gradients to generate therefrom at least one output signal representing a battery state associated with the electrochemical battery.

2. The method of claim 1, wherein the electrical impedance gradients are calculated with respect to one of the measurement frequency, a logarithm of the measurement frequency, or the index of the elements of the series of electrical impedance measurements.

3. The method of claim 1, wherein the method further comprises:
adjusting the number of elements of the series of electrical impedance gradients to a predetermined number of elements.

4. The method of claim 1, wherein the computational means include artificial neural network means configured to receive as inputs at least the series of electrical impedance gradients.

5. The method of claim 4, wherein the artificial neural network means include a deep neural network.

6. The method of claim 4, wherein the artificial neural network means include a convolutional neural network.

7. The method of claim 1, wherein the computational means receives and processes the series of electrical impedance gradients to generate therefrom at least one output signal representing a state of charge of the electrochemical battery.

8. The method of claim 1, wherein the computational means receives and processes the series of electrical impedance gradients to generate therefrom at least one output signal representing a state of health of the electrochemical battery.

9. The method of claim 1, wherein the computational means receives and processes the series of electrical impedance gradients to generate therefrom at least one output signal representing a state of function of the electrochemical battery.

10. The method of claim 1, wherein the computational means receives and processes the series of electrical impedance gradients to generate therefrom at least one output signal representing a temperature associated with the electrochemical battery.

11. The method of claim 1, wherein the method further comprises:
measuring the electrical impedance of an electrochemical battery at different measurement frequencies to provide the series of electrical impedance measurements.

12. A battery state estimating system for estimating a battery state of an electrochemical battery, the system comprising means for carrying out the steps of the method of claim 1.

13. The battery state estimating system of claim 12, the battery state estimating system further comprising:
electrical impedance measuring means configured for measuring the electrical impedance of an electrochemical battery at different measurement frequencies to provide the series of electrical impedance measurements.

* * * * *